US009564195B2

(12) United States Patent
Ji et al.

(10) Patent No.: US 9,564,195 B2
(45) Date of Patent: Feb. 7, 2017

(54) ADDRESS COMPARATOR CIRCUIT FOR GENERATING TRANSMISSION CONTROL SIGNAL, MEMORY DEVICE AND MEMORY SYSTEM INCLUDING THE SAME

(71) Applicant: SK hynix Inc., Gyeonggi-do (KR)

(72) Inventors: Jung-Hwan Ji, Gyeonggi-do (KR); Ki-Chon Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/680,801

(22) Filed: Apr. 7, 2015

(65) Prior Publication Data
US 2016/0163368 A1    Jun. 9, 2016

(30) Foreign Application Priority Data

Dec. 8, 2014   (KR) .................... 10-2014-0174917

(51) Int. Cl.
| | | |
|---|---|---|
| *G11C 7/10* | (2006.01) | |
| *G11C 7/22* | (2006.01) | |
| *G11C 8/06* | (2006.01) | |
| *G11C 8/18* | (2006.01) | |

(52) U.S. Cl.
CPC ............... *G11C 8/18* (2013.01); *G11C 7/106* (2013.01); *G11C 7/1048* (2013.01); *G11C 7/1069* (2013.01); *G11C 7/1087* (2013.01); *G11C 7/1096* (2013.01); *G11C 7/222* (2013.01); *G11C 8/06* (2013.01)

(58) Field of Classification Search
CPC ............. G11C 8/18; G11C 7/10; G11C 7/222; G11C 8/06
See application file for complete search history.

(56) References Cited

U.S. PATENT DOCUMENTS

| 6,175,535 | B1* | 1/2001 | Dhong | ..................... G11C 8/06 365/189.07 |
|---|---|---|---|---|
| 2004/0264286 | A1* | 12/2004 | Ware | .................... G11C 7/1006 365/232 |
| 2005/0127945 | A1* | 6/2005 | Park | ................ H03K 19/00361 326/52 |
| 2009/0251988 | A1* | 10/2009 | Kim | ..................... G11C 7/1018 365/233.18 |
| 2009/0268514 | A1* | 10/2009 | Mae | ........................ G11C 7/06 365/163 |
| 2012/0087201 | A1* | 4/2012 | Moon | .................. G11C 7/1039 365/233.18 |

(Continued)

FOREIGN PATENT DOCUMENTS

KR           101013459           2/2011

*Primary Examiner* — J. H. Hur

(74) *Attorney, Agent, or Firm* — IP & T Group LLP

(57) ABSTRACT

An address comparator circuit includes a first determination unit suitable for activating a first control signal when a first address corresponding to a previous read command is identical with a second address corresponding to a current read command; a second determination unit suitable for activating a second control signal when the previous and current read commands are consecutively inputted to the address comparator circuit with an interval of a specific number of clocks or less; and a blocking signal generation unit suitable for generating a blocking signal that blocks data transmission between a memory array and an external device based on the first and the second control signals.

17 Claims, 10 Drawing Sheets

(56) References Cited

U.S. PATENT DOCUMENTS

| | | | | |
|---|---|---|---|---|
| 2012/0113732 A1* | 5/2012 | Sohn | ............... | G11C 7/1057 365/191 |
| 2013/0322162 A1* | 12/2013 | Lee | ............... | G11C 11/1653 365/158 |
| 2015/0127884 A1* | 5/2015 | Ji | ............... | G11C 7/1048 711/103 |

* cited by examiner

ADDRESS COMPARATOR CIRCUIT FOR GENERATING TRANSMISSION CONTROL SIGNAL, MEMORY DEVICE AND MEMORY SYSTEM INCLUDING THE SAME

CROSS-REFERENCE TO RELATED APPLICATION(S)

The present application claims priority of Korean Patent Application No. 10-2014-0174917, filed on Dec. 8, 2014, which is incorporated herein by reference in its entirety.

BACKGROUND

1. Field

Exemplary embodiments of the present invention relate to an address comparator circuit, a memory device including the same, and a memory system including the memory device.

2. Description of the Related Art

A memory device stores external data and outputs the stored data. The memory device includes data input/output (I/O) lines along which data is transmitted. The data I/O lines include a global I/O line that transfers data between a data I/O pad and memory banks and that is shared by the memory banks and local I/O lines included in the respective memory banks. The transfer of data in a memory device is described below.

FIG. 1 is a diagram schematically illustrating the data I/O path of a memory device.

A write operation in which external data is received is described. Data inputted through a data pad DQ is loaded onto a global I/O line GIO via a reception circuit 102. When a first bank 110 is selected, the data on the global I/O line GIO is loaded onto the local I/O line pair LIO_B0 and LIOb_B0 coupled to the first bank 110 by a write driver 112. The data loaded onto the local I/O line pair LIO_B0 and LIOb_B0 is written in a selected memory cell within the first bank 110. When the second bank 120 is selected, the data of the global I/O line GIO is loaded onto the local I/O line pair LIO_B1 and LIOb_B1 of the second bank 120 by the write driver 122 and then written in a selected memory cell within the second bank 120.

A read operation in which data is output by a memory device is described below. When the first bank 110 is selected, data stored in a selected memory cell within the first bank 110 is loaded onto the local I/O line pair LIO_B0 and LIOb_B0, and then loaded onto the global I/O line GIO amplified by an I/O sense amp 111. The data on the global I/O line GIO is output to the outside of the memory device by a transmission circuit 101. When the second bank 120 is selected, data stored in a selected memory cell within the second bank 120 is output to the outside of the memory device through the local I/O line pair LIO_B1 and LIOb_B1, an I/O sense amp 121, the global I/O line GIO, and the transmission circuit 101.

FIG. 2 is a diagram illustrating an active operation and a read operation of a word line and a bit line. FIG. 2 shows a problem occurring when the read operation is repeatedly performed on a single memory cell.

Referring to FIG. 2, at a first point of time 201, the word line WL is activated in response to an active command. When the word line WL is activated, the data of a memory cell corresponding to the word line WL is loaded onto a bit line pair BL and BLb. As shown in FIG. 2, a voltage level of the primary bit line BL is higher than that of the secondary bit line BLb due to charge sharing between the memory cell and the bit line pair BL and BLb. At a second point of time 202, a bit line sense amp is activated, and a small potential difference between the bit line pair BL and BLb is amplified by the bit line sense amp. As a result, the primary bit line BL has the same level as a core voltage VCORE, i.e., a voltage of a high level used in a cell region, and the secondary bit line BLb has the same level as a ground voltage VSS.

Third to fifth points of time 203 to 205 denote sections in each of which a read operation is performed in response to a read command. In the section in which the read operation is performed, the voltage level of the bit line pair BL and BLb is transferred to the local I/O line pair LIO and LIOb. That is, the local I/O line pair LIO and LIOb may be driven by the bit line pair BL and BLb. Accordingly, the voltage level of the primary bit line BL drops, and the voltage level of the secondary bit line BLb rises. The changed voltage level of the bit line pair BL and BLb recovers to the original level by a sense amp. When the above-described read operations are consecutively repeated during the sections denoted by the third to fifth points of time 203, 204, and 205 as shown in FIG. 2, the voltage level of the bit line pair BL and BLb does not recover to the original level and the voltage difference between the bit line pair BL and BLb is gradually reduced. As a result, the voltage levels of the bit line pair BL and BLb are reversed as shown in the last section denoted by the fifth point of time 205, which cause a read fail.

The consecutive repetition of read operations is frequently performed on the same memory cell while a memory device operates. Accordingly, there is a need to prevent fails that are attributable to the consecutive repetition of read operations on the same memory cell.

SUMMARY

Various embodiments are directed to an address comparator circuit, a memory device and a memory system including the same for preventing fails caused by consecutive read operations on the same memory cell.

In an embodiment, an address comparator circuit may include: a first determination unit suitable for activating a first control signal when a first address corresponding to a previous read command is identical with a second address corresponding to a current read command; a second determination unit suitable for activating a second control signal when the previous and current read commands are consecutively inputted to the address comparator circuit with an interval of a specific number of clock cycles or less; and a blocking signal generation unit suitable for generating a blocking signal that blocks data transmission between a memory array and an external device based on the first and the second control signals.

The first determination unit may include: a comparison unit suitable for comparing the second address with the first address; and a summation unit suitable for generating the first control signal when the first and second addresses are the same.

The second determination unit may include: a D flip-flop suitable for synchronizing the previous and current read commands with a clock signal; a flag signal generation unit suitable for generating a flag signal when the interval exceeds the specific number of clock cycles; and a SR latch suitable for activating the second control signal in response to the synchronized read command, and deactivating the second control signal in response to the flag signal during a read operation.

The blocking signal generation unit may include an AND gate suitable for activating the blocking signal when the first and the second control signals are activated.

In an embodiment, a memory device may include: a memory array; a data interface unit suitable for transferring data between the memory device and an external device; and an access signal generation unit suitable for generating a transmission control signal for data transmission between the memory array and the data interface unit depending on whether read commands are consecutively inputted to the memory device with an interval of a specific number of clock cycles or less.

The access signal generation unit may include: an address comparison unit suitable for generating a blocking signal when a first address corresponding to a previous read command is identical with a second address corresponding to a current read command and the previous and current read commands are consecutively inputted to the memory device with the interval of the specific number of clock cycles or less; and a data transfer control unit suitable for generating the transmission control signal for blocking the data transmission in response to the blocking signal.

The address comparison unit may include: a first determination unit suitable for activating a first control signal when the first and the second addresses are the same; a second determination unit suitable for activating a second control signal when the previous and current read commands are consecutively inputted to the memory device with the interval of the specific number of clock cycles or less; and a blocking signal generation unit suitable for generating the blocking signal based on the first and the second control signals.

The first determination unit may include: a comparison unit suitable for comparing the second address with the first address; and a summation unit suitable for generating the first control signal when the first and second addresses are the same.

The second determination unit may include: a D flip-flop suitable for synchronizing the previous and current read commands with a clock signal; a flag signal generation unit suitable for generating a flag signal when the interval exceeds the specific number of clock cycles; and a SR latch suitable for activating the second control signal in response to the synchronized read command, and deactivating the second control signal in response to the flag signal during a read operation.

The blocking signal generation unit may include an AND gate suitable for activating the blocking signal when the first and the second control signals are activated.

The memory array may include a plurality of memory banks each comprising a plurality of memory cells.

The memory device further may include data I/O lines comprising: a plurality of pairs of local I/O lines that respectively correspond to a plurality of memory banks; a global I/O line suitable for transferring data from one of the plurality of pairs of local I/O lines corresponding to one of the plurality of memory banks to the data interface unit; and a latch suitable for maintaining a logic value of data on the global I/O line.

Each of the first address and the second address may include a bank address and a column address.

In an embodiment, a memory system may include a memory controller suitable for sending consecutive first and second read commands and respectively corresponding first and second addresses; and a memory device comprising: a memory array; a data interface unit suitable for transferring data between the memory device and the memory controller; and an access signal generation unit suitable for generating a transmission control signal for data transmission between the memory array and the data interface depending on whether the consecutive previous and current read commands are inputted to the memory device with an interval of a specific number of clock cycles or less.

The access signal generation unit may include: an address comparison unit suitable for generating a blocking signal when the first and second addresses are the same; and a data transfer control unit suitable for generating the transmission control signal for blocking the data transmission in response to the blocking signal.

The address comparison unit may include: a first determination unit suitable for activating a first control signal when the first and the second addresses are the same; a second determination unit suitable for activating a second control signal according to the previous and current read commands having the interval of the specific number of clock cycles or less; and a blocking signal generation unit suitable for generating the blocking signal based on the first and the second control signals.

The first determination unit may include: a comparison unit suitable for comparing the second address with the first address; and a summation unit suitable for generating the first control signal when the first and second addresses are the same.

The second determination unit may include: a D flip-flop suitable for synchronizing the previous and current read commands with a clock signal; a flag signal generation unit suitable for generating a flag signal when the interval exceeds the specific number of clock cycles; and a SR latch suitable for activating the second control signal in response to the synchronized read command, and deactivating the second control signal in response to the flag signal during a read operation.

The blocking signal generation unit may include an AND gate suitable for activating the blocking signal when the first and the second control signals are activated.

DETAILED DESCRIPTION

Figure 1:
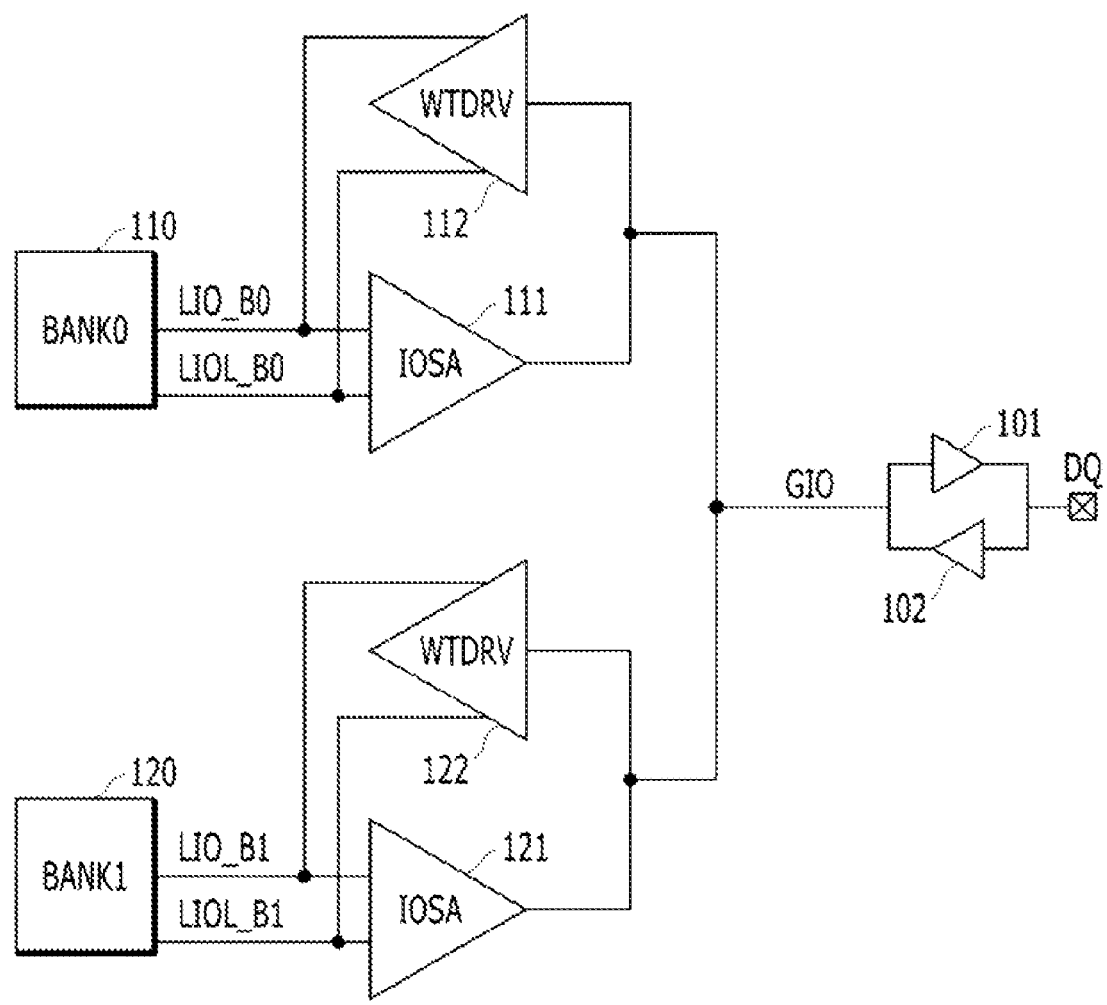
FIG. 1 is a diagram schematically illustrating the data I/O path of a memory device.
Figure 2:
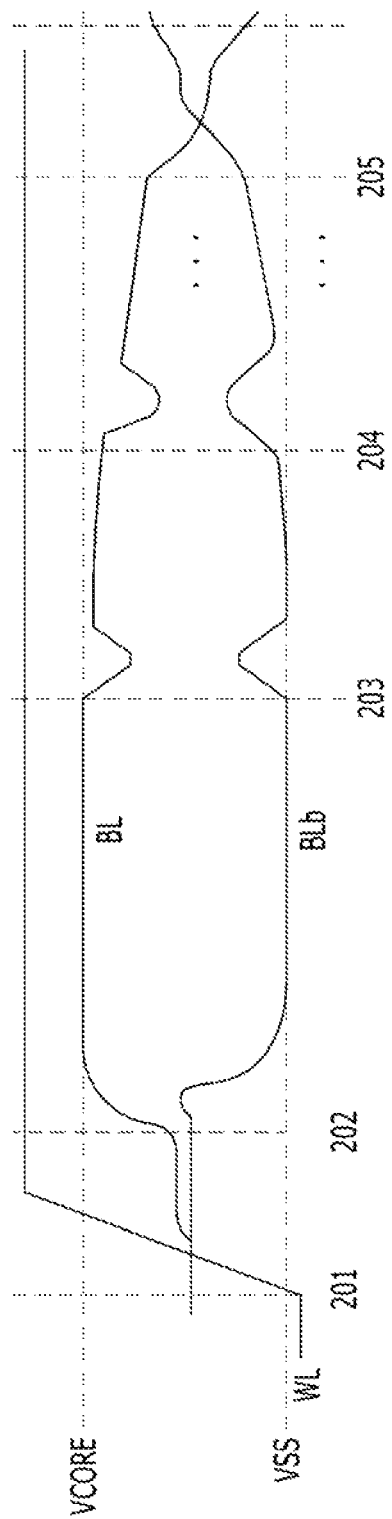
FIG. 2 is a diagram illustrating an active operation and a read operation of a word line and a bit line.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
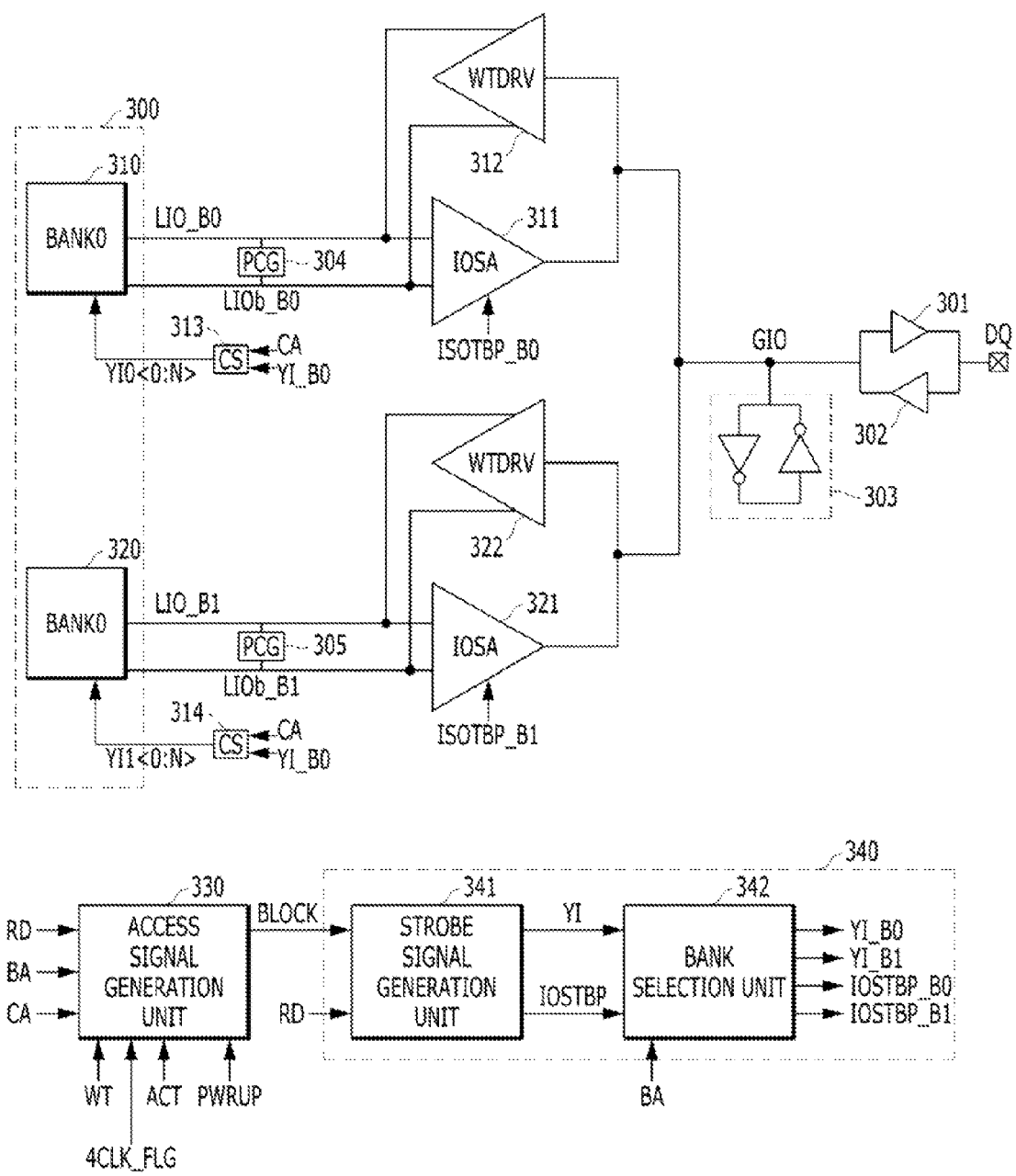
FIG. 3 is a block diagram illustrating a memory device in accordance with an embodiment of the present invention.

FIG. 3 is a block diagram illustrating a memory device in accordance with an embodiment of the present invention.

Referring to FIG. 3, the memory device may include a memory array 300, data I/O lines LIO_B0, LIOb_B0, LIO_B1, LIOb_B1, and GIO, an access signal generation unit 330 and 340, write driver 312 and 322, I/O sense amp 311 and 321, a latch unit 303, precharge units 304 and 305, column selection units 313 and 314, and a data interface unit 301 and 302.

The memory array 300 may include an array of memory cells for storing data. The memory array 300 may include a plurality of memory banks 310 and 320. Each of the plurality of memory banks 310 and 320 may include a plurality of memory cells. FIG. 3 exemplarily shows the memory array 300 including two banks 310 and 320, which may vary according to the circuit design.

The data I/O lines LIO_B0, LIOb_B0, LIO_B1, LIOb_B1, and GIO may transfer read data from the plurality of memory banks 310 and 320 to a data pad DQ of the memory device during a read operation, and may transfer write data from the data pad DQ to the plurality of memory banks 310 and 320 during a write operation.

The data I/O lines LIO_B0, LIOb_B0, LIO_B1, LIOb_B1, and GIO may include a plurality of pairs of local I/O lines LIO_B0 and LIOb_B0 and LIO_B1 and LIOb_B1, respectively corresponding to the plurality of memory banks 310 and 320, and a global I/O line GIO shared by the plurality of memory banks 310 and 320.

The global I/O line GIO may be connected to a local bus of a selected memory bank of the plurality of memory banks 310 and 320 during the read or write operation. For example, during the read operation on the first memory bank 310 of the plurality of memory banks 310 and 320, the global I/O line GIO may be connected to the first pair of local I/O lines LIO_B0 and LIOb_B0. During the write operation on the second memory bank 320, the global I/O line GIO may be connected to the second pair of local I/O lines LIO_B1 and LIOb_B1.

The plurality of pairs of local I/O lines LIO_B0 and LIOb_B0 and LIO_B1 and LIOb_B1 transfer data using a differential method, and the global I/O line GIO transfers data using a single-ended method, which may vary according to a circuit design. FIG. 3 exemplarily shows the data I/O lines LIO_B0, LIOb_B0, LIO_B1, LIOb_B1, and GIO used during both of the read operation and the write operation while data I/O lines for the read operation and data I/O lines for the write operation may be separated according to circuit design.

The access signal generation unit 330 and 340 may include an address comparison unit 330 and a data transfer control unit 340.

The address comparison unit 330 may receive a read command RD and corresponding column and bank addresses CA and BA. The address comparison unit 330 may determine whether a previous address is identical with a current address when the read command RD is consecutively received. That is, the address comparison unit 330 may determine whether a read operation for the same memory cell is consecutively performed or not. When the address comparison unit 330 consecutively receives the read command RD and addresses corresponding to each of the consecutive read commands RD are identical with one another, the address comparison unit 330 may activate a blocking signal BLOCK for preventing the transmission of data between the memory array 300 and the data I/O lines LIO_B0, LIOb_B0, LIO_B1, LIOb_B1, and GIO.

The address comparison unit 330 may compare the column and bank addresses CA and BA corresponding to a previous one of the consecutively inputted read commands RD, with the column and bank addresses CA and BA corresponding to a current one of the consecutively inputted read commands RD in order to determine whether the previous and current addresses CA and BA are the same.

When the previous and current addresses CA and BA are the same, the address comparison unit 330 may activate the blocking signal BLOCK. The address comparison unit 330 may deactivate the blocking signal BLOCK in response to one or more of a write command WT, an active command ACT, a 4-clock flag signal 4CLK_FLAG, and a power-up signal PWRUP. The 4-clock flag signal 4CLK_FLAG may be generated when the interval between the previous and current read commands RD of the consecutively inputted read commands RD is 4 clocks or more, during which data from a memory cell may be fetched in response to the previous and current read commands RD of the consecutively inputted read commands RD. Accordingly, when the interval between previous and current read commands RD of the consecutively inputted read commands RD is 4 clocks or more, the blocking signal BLOCK for preventing the transmission of data does not need to be activated.

According to the prior art, a row address received along with a previous read command is compared with a row address received along with a current read command in order to determine whether they are identical with each other. For example, assuming that memory is accessed sequentially according to active command ACT, read command RD, precharge command PCG, active command ACT and read command RD, when the two active commands ACT activate two different word lines within the same bank, although a previous read command RD and a current read command RD do not correspond to the same column address, all the column selection signals YI may need to be activated. In this case, a fail may occur without a comparison operation between row addresses because a column selection signal YI, corresponding to the current read command RD, is not activated.

However, when the interval between the previous and current read commands RD of the consecutively inputted read commands RD is 3 clocks or less, the row addresses do not need to be compared with each other because the row addresses are not changed.

Accordingly, during the read operation, the address comparison unit 330 may not perform the comparison operation to the row addresses but to the column and bank addresses CA and BA. The address comparison unit 330 will be described in detail later with reference to FIG. 4.

During the read operation, the data transfer control unit 340 may control data so that the data is transferred from the memory array 300 to the data pad DQ through the data I/O lines LIO_B0, LIOb_B0, LIO_B1, LIOb_B1, and GIO. When the blocking signal BLOCK is activated by the address comparison unit 330, that is, when two or more consecutive read operations are performed on the same memory cell and the interval between the read operations are less than 4 clocks, the data transfer control unit 340 may block the transfer of data between the memory array 300 and the data I/O lines LIO_B0, LIOb_B0, LIO_B1, LIOb_B1, and GIO.

The data transfer control unit 340 may include a strobe signal generation unit 341 and a bank selection unit 342.

During the read operation according to the activated read command RD, the strobe signal generation unit 341 may generate a column selection signal YI to determine the time of data transmission from the memory array 300 to the plurality of pairs of local I/O lines LIO_B0 and LIOb_B0 and LIO_B1 and LIOb_B1, and generate a strobe signal IOSTBP to determine the time of data transmission from the plurality of pairs of local I/O lines LIO_B0 and LIOb_B0 and LIO_B1 and LIOb_B1 to the global I/O line GIO. Data may be transmitted between the memory array 300 and the data pad DQ through the plurality of pairs of local I/O lines LIO_B0 and LIOb_B0 and LIO_B1 and LIOb_B1, and the global I/O line GIO according to the activated column selection signal YI and the strobe signal IOSTBP. The column selection signal YI may be activated earlier than the strobe signal IOSTBP because of the data transmission sequence from the memory array 300 to the plurality of pairs of local I/O lines LIO_B0 and LIOb_B0 and LIO_B1 and LIOb_B1, and eventually to the global I/O line GIO.

The data transfer control unit 340 may sequentially activate the column selection signal YI and the strobe signal IOSTBP whenever the read command signal RD is activated. However, when the blocking signal BLOCK is activated, the data transfer control unit 340 may not activate the column selection signal YI and the strobe signal IOSTBP although the read command signal RD is activated.

The bank selection unit 342 may receive the bank address BA, the column selection signal YI, and the strobe signal IOSTBP and may generate bank column selection signals YI_B0 and YI_B1 and strobe signals IOSTBP_B0 and IOSTBP_B1. The bank selection unit 342 may activate one of the bank column selection signals YI_B0 and YI_B1 corresponding to a bank selected by the bank address BA when the column selection signal YI is activated, and may activate one of the strobe signals IOSTBP_B0 and IOSTBP_B1 corresponding to the selected bank when the strobe signal IOSTBP is activated. For example, when the second bank 320 is selected by the bank address BA, the second bank column selection signal YI_B1 may be activated when the column selection signal YI is activated, and the second strobe signal IOSTBP_B1 may be activated when the strobe signal IOSTBP is activated.

The first column selection unit 313 of the column selection unit 313 and 314 may generate column selection signals YI0<0:N> in response to the first bank column selection signal YI_B0 and the column address CA.

When the first bank column selection signal YI_B0 is activated, the first column selection unit 313 may activate one of the column selection signals YI0<0:N> corresponding to a column selected by the column address CA. Data of the first bank 310 may be transferred from the selected column to the first pair of local I/O lines LIO_B0 and LIOb_B0.

Likewise, when the second bank column selection signal YI_B1 is activated, the second column selection unit 314 may activate one of the column selection signals YI1<0:N> corresponding to a column selected by the column address CA. Data of the second bank 320 may be transferred from the selected column to the second pair of local I/O lines LIO_B1 and LIOb_B1.

The first I/O sense amp 311 of the I/O sense amp 311 and 321 may drive the data of the first pair of local I/O lines LIO_B0 and LIOb_B0 to the global I/O line GIO in response to the activation of the first strobe signal IOSTBP_B. Likewise, the second I/O sense amp 321 of the I/O sense amp 311 and 321 may drive the data of the second pair of local I/O lines LIO_B1 and LIOb_B1 to the global I/O line GIO in response to the activation of the second strobe signal IOSTBP_B1.

The first write driver 312 of the write driver 312 and 322 may drive the data on the global I/O line GIO to the first pair of local I/O lines LIO_B0 and LIOb_B0 during the write operation to the first bank 310. The second write driver 322 of the write driver 312 and 322 may drive the data on the global I/O line GIO to the second pair of local I/O lines LIO_B1 and LIOb_B1 during the write operation to the second bank 320.

The transmission circuit 301 of the data interface unit 301 and 302 may output the data on the global I/O line GIO to the outside (e.g. to an external device) of the memory device through the data pad DQ during the read operation. The reception circuit 302 of the data interface unit 301 and 302 may transfer data from the outside of the memory device to the global I/O line GIO through the data pad DQ.

The precharge units 304 and 305 may precharge the plurality of pairs of local I/O lines LIO_B0 and LIOb_B0 and LIO_B1 and LIOb_B1 to a precharge voltage level during idle time between the read and/or write operations.

The latch 303 may prevent floating of the global I/O line GIO. When consecutive read operations are performed on the same memory cell, the latch 303 may maintain the latest data on the global I/O line GIO and thus may support a following read operation for the same memory cell although data is not transferred from the memory array 300.

Hereinafter, the operation of the memory device will be described.

Firstly, during a common read operation with an intermittently inputted read command RD, the blocking signal BLOCK may be deactivated, and the data transfer control unit 340 may normally generate the bank column selection signals YI_B0 and YI_B1 and the strobe signals IOSTBP_B0 and IOSTBP_B1. Accordingly, data may be transmitted from the memory array 300 to the transmission circuit 301 through the plurality of pairs of local I/O lines LIO_B0 and LIOb_B0 and LIO_B1 and LIOb_B1 and the global I/O line GIO. For example, during the read operation to the first bank 310, the data of the first bank 310 may be loaded onto the first pair of local I/O lines LIO_B0 and LIOb_B0. The data on the first pair of local I/O lines LIO_B0 and LIOb_B0 may be loaded onto the global I/O line GIO by the first I/O sense amp 311. The data on the global I/O line GIO may be output to the outside of the memory device through the transmission circuit 301.

Secondly, during consecutive read operations to the same memory cell according to the consecutively inputted read commands, the interval of which is 3 clocks or less, with the addresses representing the same memory cell, the address comparison unit 330 may activate the blocking signal BLOCK. When the blocking signal BLOCK is activated, the data transfer control unit 340 may not activate the bank column selection signals YI_B0 and YI_B1 and the strobe signals IOSTBP_B0 and IOSTBP_B1. Accordingly, the transfer of data from the memory array 300 to the plurality of pairs of local I/O lines LIO_B0 and LIOb_B0 and LIO_B1 and LIOb_B1 and the transfer of data from the plurality of pairs of local I/O lines LIO_B0 and LIOb_B0 and LIO_B1 and LIOb_B1 to the global I/O line GIO may not be performed. Furthermore, the previous data loaded onto the global I/O line GIO may be output to the outside of the memory device through the latch 303 and the transmission circuit 301. Accordingly, a fail attributable to consecutive read operations on the same memory cell can be prevented because a column (e.g., a bit line) selected within the memory array 300 is not connected to the plurality of pairs of local I/O lines LIO_B0 and LIOb_B0 and LIO_B1 and LIOb_B1.

Figure 4:
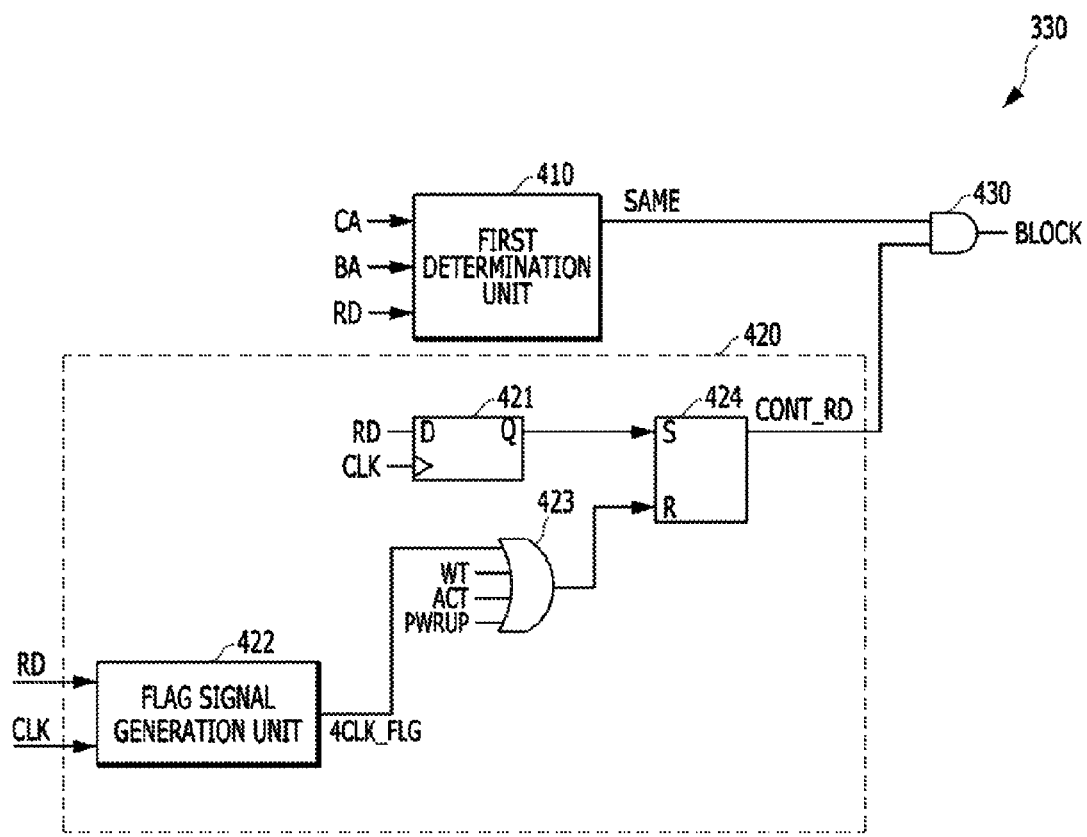
FIG. 4 is a block diagram illustrating an address comparison unit shown in FIG. 3.

FIG. 4 is a block diagram illustrating the address comparison unit 330 shown in FIG. 3.

Referring to FIG. 4, the address comparison unit 330 may include a first determination unit 410, a second determination unit 420, and a blocking signal generation unit 430.

The first determination unit 410 may determine whether the previous and current addresses CA and BA, respectively corresponding to the previous and current read commands RD, are the same while the second determination unit 420 may determine whether the previous and current read commands RD are consecutively inputted to the memory device.

The first determination unit 410 may compare the previous and current addresses CA and BA respectively corresponding to the previous and current read commands RD and may activate a first control signal SAME when the previous and current addresses CA and BA are the same.

The second determination unit 420 may include a D flip-flop 421, a flag signal generation unit 422, an OR gate 423, and a SR-latch 424.

The D flip-flop 421 may synchronize the read command RD with a clock signal CLK.

The flag signal generation unit 422 may generate the 4-clock flag signal 4CLK_FLAG in response to the clock signal CLK when the interval between the consecutively inputted read commands RD is 4 clocks or more. The flag signal generation unit 422 is described in detail later with reference to FIGS. 5 and 7.

The SR-latch 424 may activate a continuation signal CONT_RD in response to the activation of the output signal of the D flip-flop 421, and may deactivate the continuation signal CONT_RD in response to one or more of the power-up signal PWRUP, the active command ACT, the write command WT, or the 4-clock flag signal 4CLK_FLAG through the OR gate 423.

Accordingly, the continuation signal CONT_RD may be activated during the read operation, but may be deactivated when one or more of power-up, active, and write operations are performed after activation or when the interval between the consecutively inputted read commands RD is 4 clocks or more. In other words, the continuation signal CONT_RD may be deactivated when the read commands RD are discontinuously inputted or when the interval between the consecutively inputted read commands RD is 4 clocks or more, and may be activated when the interval between the consecutively inputted read commands RD is 3 clocks or less.

The blocking signal generation unit 430 may activate the blocking signal BLOCK when the continuation signal CONT_RD is activated and the first control signal SAME is activated. The blocking signal generation unit 430 may include an AND gate.

As a result, the blocking signal BLOCK may be activated when the interval between consecutively inputted read commands is 3 clocks or less for the same address while any other operational command is not inputted to the memory device.

Figure 5:
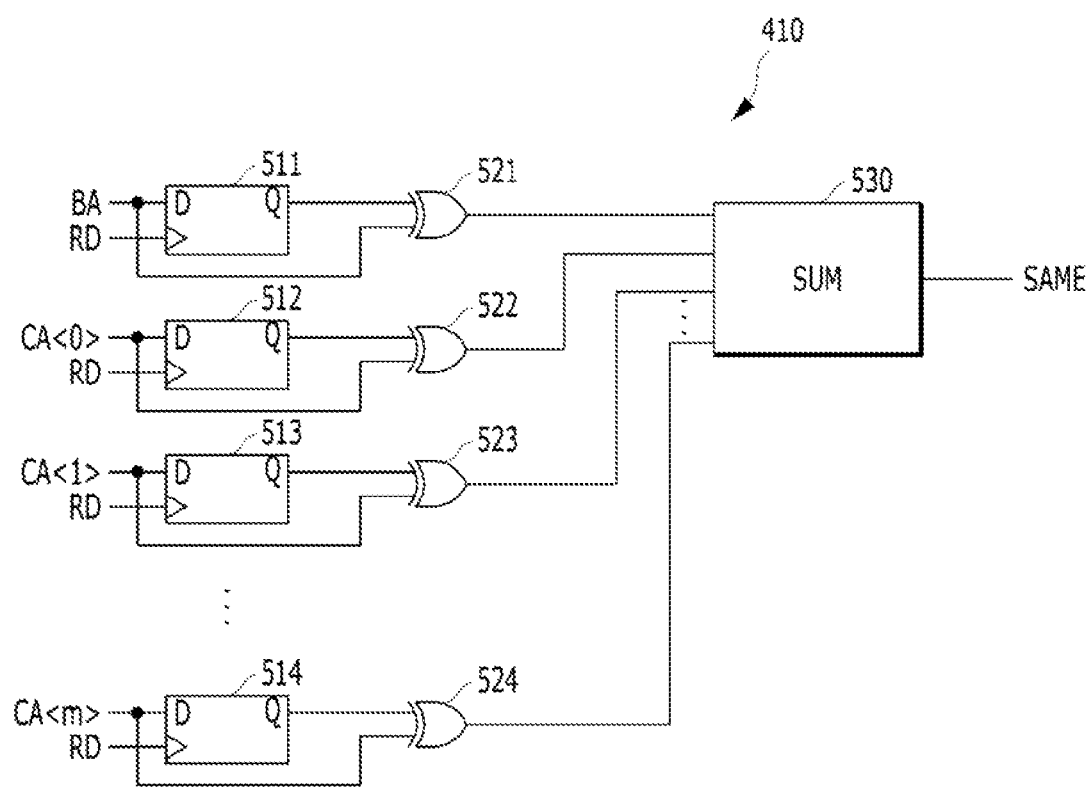
FIG. 5 is a block diagram illustrating a first determination unit shown in FIG. 4.

FIG. 5 is a block diagram illustrating the first determination unit 410 shown in FIG. 4.

Referring to FIG. 5, the first determination unit 410 may include a plurality of D flip-flops 511-514, a plurality of XOR gates 521-524, and a summation unit 530.

The plurality of D flip-flops 511-514 may synchronize the bits of the bank address BA and the column address CA<0:m> with the read command RD, and may receive the synchronized bits. The D flip-flops 511-514 may receive the bank address BA and the column address CA<0:m> along with the current read command RD while storing the bank address BA and the column address CA<0:m> corresponding to the previous read command RD. Although FIG. 5 exemplarily shows the bank address BA of a single bit and the column addresses CA<0:m> of m bits, these details may vary according to circuit design.

The plurality of XOR gates 521-524 may compare the column and bank addresses CA and BA outputted from the plurality of D flip-flops 511-514 with the column and bank addresses CA and BA inputted to the plurality of D flip-flops 511-514. In other words, the plurality of XOR gates 521-524 may compare the column and bank addresses CA and BA corresponding to the currently inputted read command RD with the column and bank addresses CA and BA corresponding to the previously inputted read command RD. The summation unit 530 may activate the first control signal SAME when the comparison result of the plurality of XOR gates 521-524 indicates that the column and bank addresses CA and BA, corresponding to the currently inputted read command RD, and the column and bank addresses CA and BA, corresponding to the previously inputted read command RD, are the same as each other.

Figure 6:
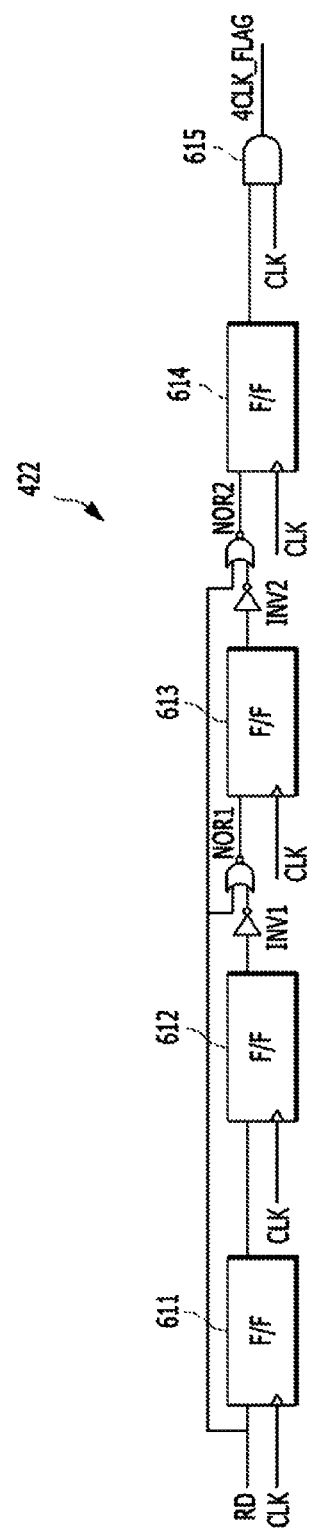
FIG. 6 is a block diagram illustrating a flag signal generation unit shown in FIG. 4.

FIG. 6 is a block diagram illustrating the flag signal generation unit 422 shown in FIG. 4.

Referring to FIG. 6, the flag signal generation unit 422 may include a plurality of D flip-flops 611-614 and an AND gate 615. The plurality of D flip-flops 611-614 may sequentially delay the read command RD according to the clock signal CLK. The AND gate 615 may perform an AND operation to the final output of the plurality of D flip-flops 611-614 and the clock signal CLK. The flag signal generation unit 422 may generate the 4-clock flag signal 4CLK_FLAG when the read command RD is consecutively inputted more than 4 times according to the number of D flip-flops 611-614. The flag signal generation unit 422 may further include inverters INV1 and INV2, respectively, for inverting the output of a previous D flip-flop and NOR gates NOR1 and NOR2, respectively, for performing a NOR operation to the inverted output and the read command RD at the input nodes of the last 2 D flip-flops in order to deactivate the 4-clock flag signal 4CLK_FLAG by blocking the input to the last one or two D flip-flops when the interval between the previous and current read commands RD is 3 clocks or less.

Figure 7:
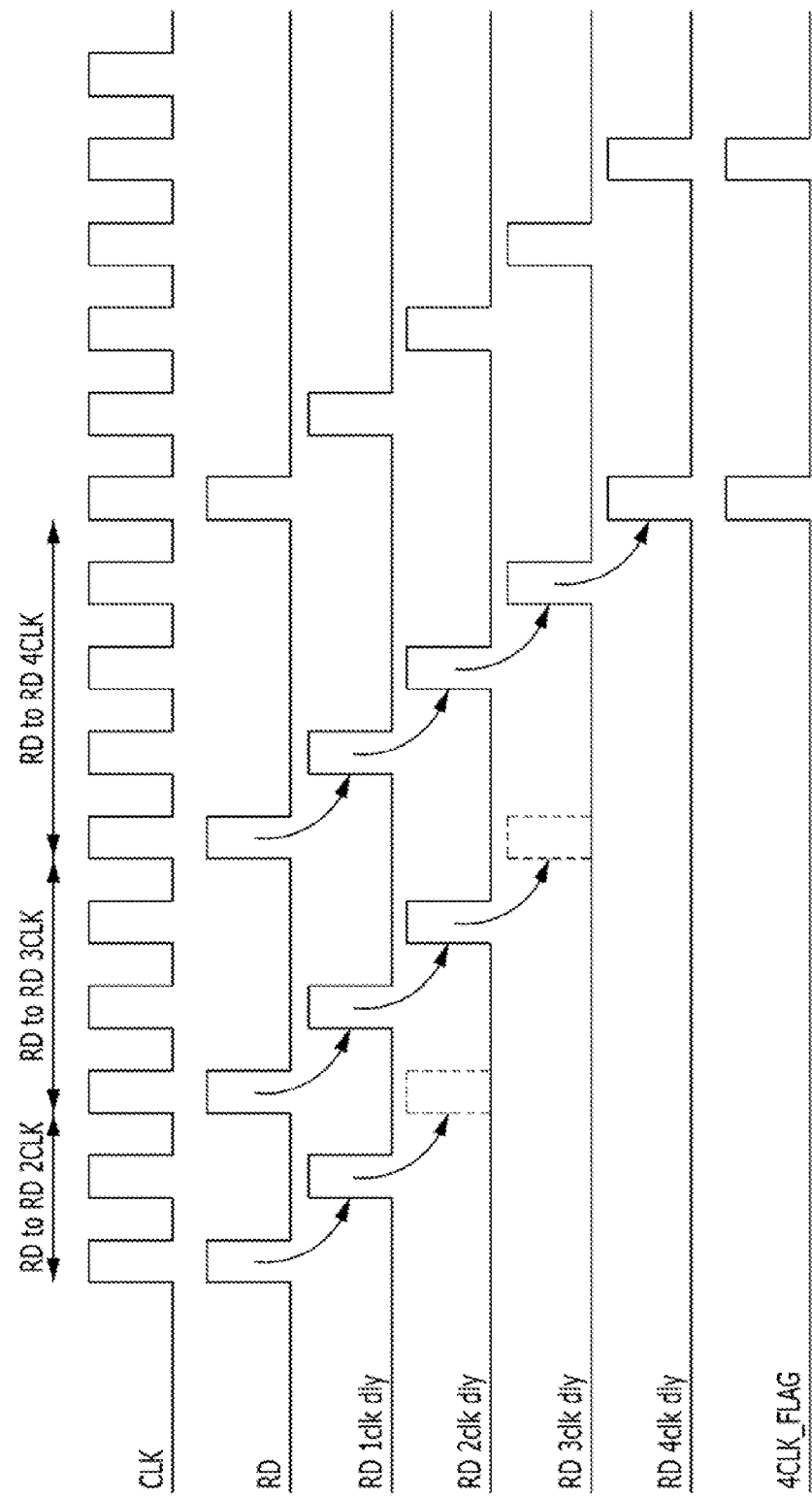
FIG. 7 is a timing diagram illustrating an operation of a flag signal generation unit shown in FIG. 6.

FIG. 7 is a timing diagram illustrating an operation of the flag signal generation unit 422 shown in FIG. 6.

Referring to FIGS. 6 and 7, the read commands RD are consecutively inputted. FIG. 7 shows 3 cases of input of the previous and current read commands RD with intervals of 2 clocks, 3 clocks, and 4 clocks. The consecutively inputted read commands RD are sequentially delayed and output through the plurality of D flip-flops 611-614. When the interval between the previous and current read commands RD is 2 clocks or 3 clocks, the read commands RD may be blocked without being delayed in the middle of the plurality of D flip-flops 611-614. Accordingly, only when the interval between the previous and current read commands RD is 4 clocks or more, the 4-clock flag signal 4CLK_FLAG may be activated.

Figure 8:
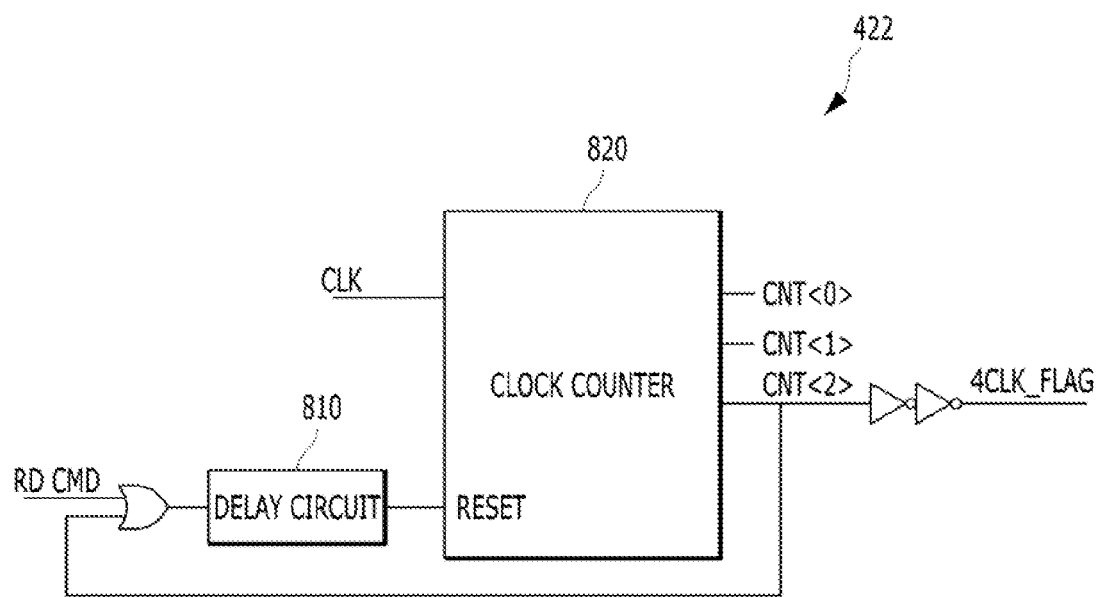
FIG. 8 is a block diagram illustrating a flag signal generation unit shown in FIG. 4.

FIG. 8 is a block diagram illustrating the flag signal generation unit 422 shown in FIG. 4.

Referring to FIG. 8, the flag signal generation unit 422 may include a delay circuit 810 and a clock counter 820.

The delay circuit 810 may delay the consecutively inputted read commands RD or a third count signal CNT<2> of first to third count signals CNT<0:2>, which are outputted from the clock counter 820 for some amount of time, and may output the delayed signal to the clock counter 820 as a reset signal RESET.

The clock counter 820 may be reset whenever the clock counter 820 receives the read command RD or the third count signals CNT<2> so that it counts clocks from the beginning.

The clock counter 820 may generate the first to third count signals CNT<0>-CNT<2> by sequentially counting the clock signal CLK. The third count signal CNT<2> may be output as the 4-clock flag signal 4CLK_FLAG. When the clock counter 820 receives the clock signal CLK four times, the third count signal CNT<2> becomes high level and is output as the 4-clock flag signal 4CLK_FLAG. When the clock counter 820 receives the read command RD before receiving the clock signal CLK four times, the clock counter 820 may be reset and may count the clock signal CLK from the beginning. In other words, when the interval between the read commands RD is 3 clocks or less, for example, when the interval is 2 clocks or 3 clocks, the clock counter 820 may be reset in response to the read command RD delayed by the delay circuit 810.

Figure 9:
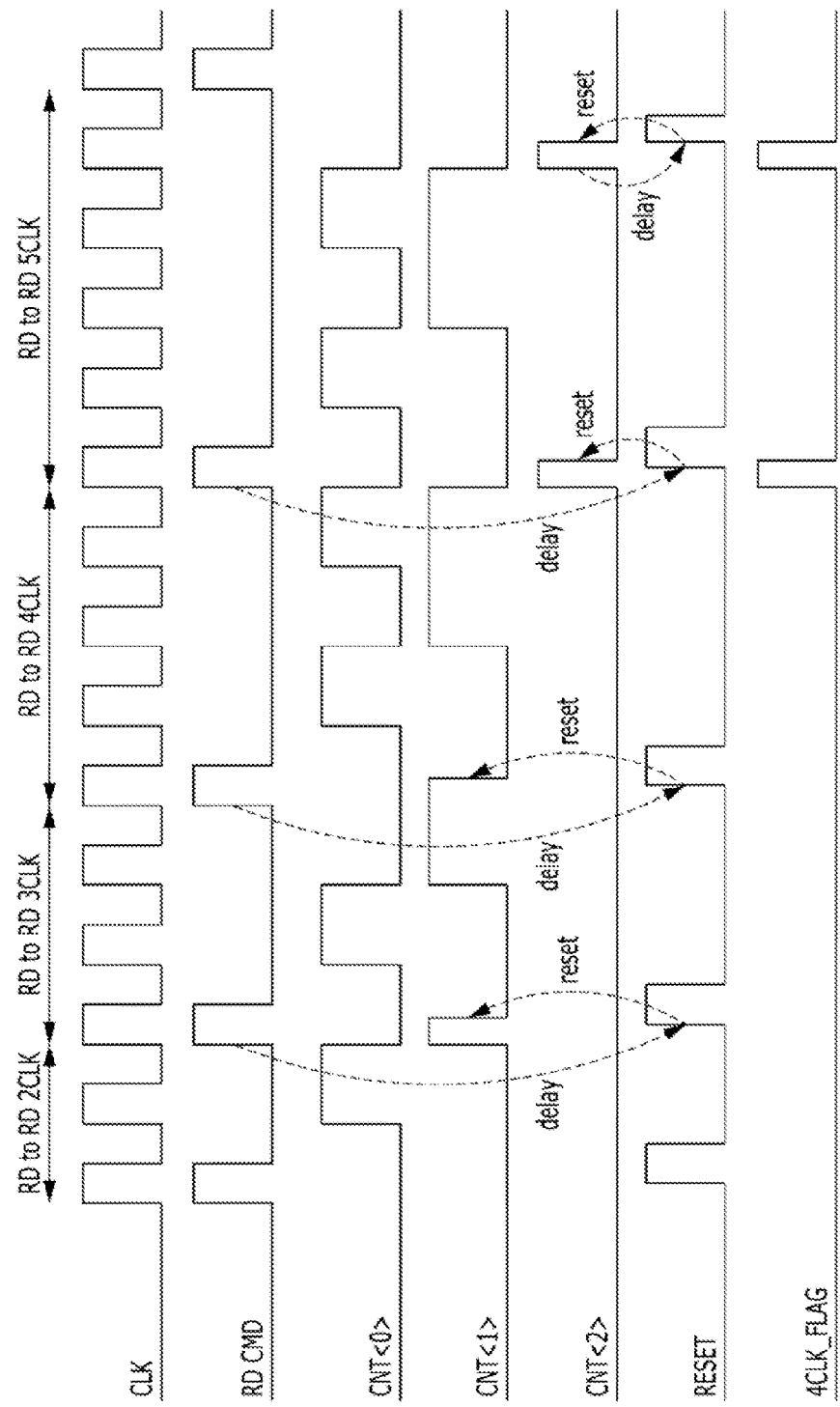
FIG. 9 is a timing diagram illustrating an operation of a flag signal generation unit shown in FIG. 8.

FIG. 9 is a timing diagram illustrating an operation of the flag signal generation unit 422 shown in FIG. 8.

Referring to FIG. 9, the read command RD may be consecutively inputted to the delay circuit 810, may be delayed by the delay circuit 810, and then inputted to the clock counter 820 as the reset signal RESET. The clock counter 820 may sequentially count the clock signal CLK and output the first to third count signals CNT<0>-CNT<2>. As shown in FIG. 9, when the interval between the consecutively inputted read commands RD is 2 clocks or 3 clocks, the reset signal RESET may be activated, and thus the clock counter 820 may be reset and count the clock signal CLK again from the beginning. When the interval between consecutively inputted read commands RD is 4 clocks (i.e., RD to RD 4CLK), the third count signal CNT<2> may be activated, and thus the 4-clock flag signal 4CLK_FLAG may be activated. When the interval between the inputted read commands RD is 5 clocks or more, the delay circuit 810 may output the reset signal RESET to the clock counter 820 according to the third count signal CNT<2> activated at the fourth input of the clock signal CLK in order to reset the clock counter 820.

When the 4-clock flag signal 4CLK_FLAG is activated as described with reference to FIGS. 6 to 9, the blocking signal BLOCK may be deactivated.

Figure 10:
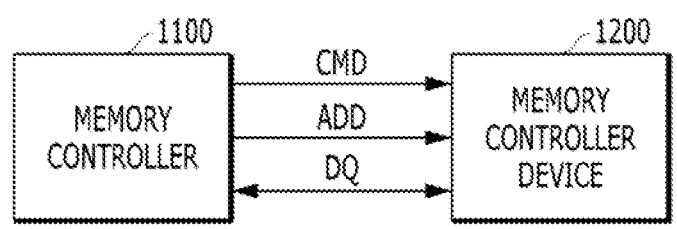
FIG. 10 is a block diagram illustrating a memory system in accordance with an embodiment of the present invention.

FIG. 10 is a block diagram illustrating a memory system in accordance with an embodiment of the present invention.

Referring to FIG. 10, the memory system may include a memory controller 1100 and the memory device 1200 described with reference to FIGS. 3 to 9.

The memory controller 1100 may apply commands CMD and addresses ADD to the memory device 1200, may exchange data DQ with the memory device 1200, and may control the active, read and write operations of the memory device 1200. The addresses ADD applied from the memory controller 1100 to the memory device 1200 may include the bank address BA and a normal address. When the normal address is applied along with a row-series command, for example, the active command, it may be recognized as a row address. When the normal address is applied along with a column-series command, for example, the read or write command, it may be recognized as the column address CA.

When the memory controller 1100 applies the read command to the memory device 1200, data may be read from a memory array within the memory device 1200 and transferred to the memory controller 1100. When the memory controller 1100 consecutively applies the read commands to the memory device 1200 with the interval of 3 clocks or less for the same address ADD, data may not be read from the memory array within the memory device 1200, and the latest data corresponding to the same address ADD and maintained on the global I/O line GIO by the latch 303 may be transferred to the memory controller 1100.

In accordance with the embodiments of the present invention, the occurrence of fails can be prevented although consecutive read operations are performed on the same memory cell in the memory device.

Although various embodiments have been described for illustrative purposes, it will be apparent to those skilled in the art that various changes and modifications may be made without departing from the spirit and scope of the invention as defined in the following claims.

What is claimed is:

1. An address comparator circuit, comprising:
   a first determination unit suitable for activating a first control signal when a first address corresponding to a previous read command is identical with a second address corresponding to a current read command;
   a second determination unit suitable for activating a second control signal when the previous and current read commands are consecutively inputted to the address comparator circuit with an interval of a specific number of clock cycles or less; and
   a blocking signal generation unit suitable for generating a blocking signal that blocks data transmission between a memory array and an external device based on the first and the second control signals when the first address is identical with the second address,
   wherein the blocking signal is deactivated when a flag signal is activated even though the first address is identical with the second address, the flag signal being activated when the interval of the consecutive previous and current read commands exceeds the specific number of clock cycles.

2. The address comparator circuit of claim 1, wherein the first determination unit comprises:
   a comparison unit suitable for comparing the second address with the first address; and
   a summation unit suitable for generating the first control signal when the first and second addresses are identical.

3. The address comparator circuit of claim 2, wherein the second determination unit comprises:
   a D flip-flop suitable for synchronizing the previous and current read commands with a clock signal;
   a flag signal generation unit suitable for generating the flag signal based on the interval; and
   a SR latch suitable for activating the second control signal in response to the synchronized read command, and deactivating the second control signal in response to the flag signal during a read operation.

4. The address comparator circuit of claim 1, wherein blocking signal generation unit comprises an AND gate suitable for activating the blocking signal when the first and the second control signals are activated.

5. A memory device, comprising:
a memory array;
a data interface unit suitable for transferring data between the memory device and an external device; and
an access signal generation unit suitable for generating a transmission control signal for data transmission between the memory array and the data interface unit depending on whether read commands are consecutively inputted to the memory device with an interval of a specific number of clock cycles or less,
wherein the access signal generation unit comprises:
an address comparison unit suitable for generating a blocking signal when a first address corresponding to a previous read command is identical with a second address corresponding to a current read command and the previous and current read commands are consecutively inputted to the memory device with the interval of the specific number of clock cycle or less,
wherein the address comparison unit comprises:
a first determination unit suitable for activating a first control signal when the first and the second addresses are identical;
a second determination unit suitable for activating a second control signal when the previous and current read commands are consecutively inputted to the memory device with the interval of the specific number of clock cycles or less; and
a blocking signal generation unit suitable for generating the blocking signal based on the first and the second control signals,
wherein the blocking signal is deactivated when a flag signal is activated even though the first address is identical with the second address, the flag signal being activated when the interval of the consecutive previous and current read commands exceeds the specific number of clock cycles.

6. The memory device of claim 5, wherein the access signal generation unit further comprises:
a data transfer control unit suitable for generating the transmission control signal for blocking the data transmission in response to the blocking signal.

7. The memory device of claim 5, wherein the first determination unit comprises:
a comparison unit suitable for comparing the second address with the first address; and
a summation unit suitable for generating the first control signal when the first and second addresses are identical.

8. The memory device of claim 7, wherein the second determination unit comprises:
a D flip-flop suitable for synchronizing the previous and current read commands with a clock signal;
a flag signal generation unit suitable for generating the flag signal based on the interval; and
a SR latch suitable for activating the second control signal in response to the synchronized read command, and deactivating the second control signal in response to the flag signal during a read operation.

9. The memory device of claim 5, wherein the blocking signal generation unit comprises an AND gate suitable for activating the blocking signal when the first and the second control signals are activated.

10. The memory device of claim 6, wherein the memory array comprises a plurality of memory banks each comprising a plurality of memory cells.

11. The memory device of claim 10, further comprising data I/O lines comprising:

a plurality of pairs of local I/O lines that respectively correspond to the plurality of memory banks;
a global I/O line suitable for transferring data from one of the plurality of pairs of local I/O lines corresponding to one of the plurality of memory banks to the data interface unit; and
a latch suitable for maintaining a logic value of data on the global I/O line.

12. The memory device of claim 6, wherein each of the first address and the second address comprise a bank address and a column address.

13. A memory system comprising:
a memory controller suitable for sending consecutive previous and current read commands and respectively corresponding first and second addresses; and
a memory device comprising:
a memory array;
a data interface unit suitable for transferring data between the memory device and the memory controller; and
an access signal generation unit suitable for generating a transmission control signal for data transmission between the memory array and the data interface unit depending on whether the consecutive previous and current read commands are inputted to the memory device with an interval of a specific number of clock cycles or less,
wherein the access signal generation unit comprises:
an address comparison unit suitable for generating a blocking signal when the first and second addresses are identical,
wherein the address comparison unit comprises:
a first determination unit suitable for activating a first control signal when the first and the second addresses are identical;
a second determination unit suitable for activating a second control signal according to the previous and current read commands having the interval of the specific number of clock cycles or less; and
a blocking signal generation unit suitable for generating the blocking signal based on the first and the second control signals,
wherein the blocking signal is deactivated when a flag signal is activated even though the first address is identical with the second address, the flag signal being activated when the interval of the consecutive previous and current read commands exceeds the specific number of clock cycles.

14. The memory system of claim 13, wherein the access signal generation unit further comprises:
a data transfer control unit suitable for generating the transmission control signal for blocking the data transmission in response to the blocking signal.

15. The memory system of claim 13, wherein the first determination unit comprises:
a comparison unit suitable for comparing the second address with the first address; and
a summation unit suitable for generating the first control signal when the first and second addresses are identical.

16. The memory system of claim 15, wherein the second determination unit comprises:
a D flip-flop suitable for synchronizing the previous and current read commands with a clock signal;
a flag signal generation unit suitable for generating the flag signal based on the interval; and
a SR latch suitable for activating the second control signal in response to the synchronized read command, and deactivating the second control signal in response to the flag signal during a read operation.

17. The memory system of claim 13, wherein the blocking signal generation unit comprises an AND gate suitable for activating the blocking signal when the first and the second control signals are activated.

* * * * *